(12) United States Patent
Rzyski

(10) Patent No.: US 8,965,727 B2
(45) Date of Patent: Feb. 24, 2015

(54) INTELLIGENT LOW NOISE DESIGN

(75) Inventor: Eugene Rzyski, Irvine, CA (US)

(73) Assignee: OmniPhase Research Laboratories, Inc., Newport Beach, CA (US)

( * ) Notice: Subject to any disclaimer, the term of this patent is extended or adjusted under 35 U.S.C. 154(b) by 449 days.

(21) Appl. No.: 11/134,546

(22) Filed: May 20, 2005

(65) Prior Publication Data

US 2006/0261908 A1 Nov. 23, 2006

(51) Int. Cl.
*G01R 35/00* (2006.01)
*H03F 1/26* (2006.01)
*H03F 1/32* (2006.01)

(52) U.S. Cl.
CPC ............... *H03F 1/26* (2013.01); *H03F 1/3223* (2013.01); *H03F 1/3229* (2013.01); *H03F 2200/372* (2013.01); *H03F 2201/3212* (2013.01)
USPC .......................................... 702/111; 330/149

(58) Field of Classification Search
USPC .......... 330/149, 127, 130, 132, 136; 324/620, 324/622, 637, 641, 612–613, 616–617; 702/111, 69, 57, 72, 75–77, 81, 702/106–108, 112, 127, 189–191, 197, 702/66–67, 84–85, 182–185, 194–195; 375/224, 256, 296–298, 371, 226–227; 331/16, 23, 1 R, 25, 44, 48, 18–19
See application file for complete search history.

(56) References Cited

U.S. PATENT DOCUMENTS

| 4,714,873 | A | * | 12/1987 | McPherson et al. | 324/613 |
|---|---|---|---|---|---|
| 4,801,861 | A | * | 1/1989 | Ashley et al. | 324/613 |
| 4,918,373 | A | * | 4/1990 | Newberg | 324/613 |
| 5,179,344 | A | * | 1/1993 | Najle et al. | 324/613 |
| 5,337,014 | A | * | 8/1994 | Najle et al. | 324/622 |
| 5,608,331 | A | * | 3/1997 | Newberg et al. | 324/613 |
| 5,661,439 | A | * | 8/1997 | Watkins et al. | 331/1 R |
| 5,796,850 | A | * | 8/1998 | Shiono et al. | 381/94.1 |
| 5,903,823 | A | * | 5/1999 | Moriyama et al. | 455/126 |
| 5,952,834 | A | * | 9/1999 | Buckley | 324/613 |
| 6,172,564 | B1 | * | 1/2001 | Rzyski | 330/149 |
| 6,393,372 | B1 | * | 5/2002 | Rzyski | 702/111 |
| 6,496,064 | B2 | * | 12/2002 | Rzyski | 330/149 |
| 6,621,277 | B2 | * | 9/2003 | Mar | 324/622 |
| 6,794,857 | B2 | * | 9/2004 | Toyoda et al. | 324/76.78 |

OTHER PUBLICATIONS

Fisk et al., Application of Fiber-Optic Delay Lines in Radar Phase Noise Measurement, Sep. 20-22, 1994, AUTOTESTCON 1994, IEEE Systems Readiness Technology Conference, pp. 179-182.*
Search Report of PCT/US06/19375, Oct. 3, 2006, Eugene Rzyski.

* cited by examiner

*Primary Examiner* — Toan Le
(74) *Attorney, Agent, or Firm* — Francisco A. Rubio-Campos; The Eclipse Group LLP

(57) ABSTRACT

An automated phase noise test measurement system includes a software controlled phase shifter to maintain quadrature so that a carrier may be removed from a signal provided by UUT. In this fashion, the UUT's phase noise may be measured. Based upon the UUT's measured phase noise, controllable variable(s) within the UUT are tuned so as to minimize the measured phase noise.

20 Claims, 5 Drawing Sheets

INTELLIGENT LOW NOISE DESIGN

FIELD OF INVENTION

This invention relates to phase noise measurements and more particularly to low noise design of components and systems using feedback from an automated phase noise test measurement system.

BACKGROUND

Noise in electrical systems and other types of systems such as electro-optic and electro-acoustic may disrupt both the amplitude and phase of signals. However, because many systems are relatively insensitive to fluctuations in amplitude, the fluctuations in phase (denoted as phase noise) are generally more problematic. For example, an oscillator may be designed to output a sinusoid at a desired frequency. Oscillators typically include some type of amplitude-limiting feature so that only phase noise will be a major noise contributor to the output sinusoid.

Because phase noise is such an important factor of overall noise, designers often desire a measure of the phase noise for a given system. Various approaches have been used to characterize phase noise. For example, amplifiers have been characterized by inputting a signal of known frequency into the amplifier and measuring a resulting amplified output in a spectrum analyzer. But the sensitivity of such an approach is limited by the relatively-poor sensitivity of the spectrum analyzer. Moreover, it is difficult to measure phase noise at frequencies close to the carrier frequency.

Unlike a spectrum analyzer, a phase-locked discriminator system has relatively good sensitivity and allows measurements close to the carrier frequency. However, the configuration of a phase-locked discriminator system is cumbersome and time consuming. Thus, an automated phase-locked discriminator noise test measurement system has been developed as described in U.S. Pat. No. 6,393,372 that alleviates the cumbersome nature of such systems. FIG. 1 illustrates an embodiment of such an automated system 1. A low-noise source 9 provides an input signal 11 for driving a unit-under-test (UUT) 3. UUT 3 may be any device for which a user desires a phase noise test measurement such as an amplifier, phase-shifter, diplexer or other suitable device or system of devices. UUT 3 receives the input from source 9 and processes it to provide an output signal 5. For example, if UUT 3 is an amplifier, output signal 5 would be an amplified version of input signal 11. Output signal 5 is amplified by variable amplifier 15 to provide an input signal 23 to a mixer 21. Source 9 also provides a version of input signal 11 to a variable phase-shifter 29. Variable phase-shifter 29 shifts input signal 11 by 90 degrees to provide a phase-shifted signal 25 to another input port of mixer 21. In this fashion, the "carrier" signal (input signal 11) is eliminated from a mixer output signal 41. To keep output signal 41 in the proper dynamic range of an analog-to-digital converter (ADC) 49, mixer output signal 41 is processed by a low-noise matching amplifier 43 to provide an output signal 42 to ADC 49.

To eliminate the carrier signal, the phase-shifted signal 25 must be in quadrature (shifted 90 degrees) with respect to the carrier. If quadrature is not established, a DC offset will be present in a digital output 44 from ADC 49. A processor 55 monitors digital output 44 and controls phase-shifter 29 using a control signal 65 to maintain quadrature. The elimination of the carrier signal from low-noise source 9 also depends upon whether the carrier (input signal 11) and the phase-shifted version of the carrier (signal 25) are of equal power when entering mixer 21. Thus, analogous to the control of phase-shifter 29, processor 55 also controls variable amplifier 15 responsive to processing digital signal 44 using a control signal 67 to maintain equal powers for signals 25 and 23. These powers need not be maintained exactly equal but instead may merely be within a sufficient range of each other so that linear operation of mixer 21 is assured. Those of ordinary skill in the art will appreciate that variable amplifier 15 does not just amplify but may also attenuate responsive to control signal 67. For example, if UUT 3 is an amplifier, variable amplifier 15 will have to attenuate output signal 5 to keep signals 23 and 25 in comparative power equality. Processor 55 may also control low-noise matched amplifier 43 using a control signal 71 to maintain signal 42 in the proper dynamic range for ADC 49.

Having controlled the components for quadrature operation, processor 55 eliminates the carrier from digital output signal 44 from ADC 49 such that digital output signal 44 simply represents the phase noise. The phase noise injected by low noise source 9 may be accounted for by a calibrating operation such that UUT 3 is removed and source 9 simply feeds amplifier 15 directly, although such a direct feed may occur through a delay line (not illustrated). The resulting phase noise in digital signal 44 during calibration may be stored in a memory associated with processor 55. Thus, during testing of UUT 3, processor 55 (or a spectrum analyzer associated with processor 55) may perform a fourier analysis of digital signal 44 to determine the phase noise power. The measured phase noise may then be adjusted by the phase noise injected by source 9 to determine the additive phase noise supplied by UUT 3.

The phase noise measured in digital signal 44 depends upon the frequency of input signal 11 provided by source 9. For example, UUT 3 may be quite noisy at one frequency but less so at another. To measure phase noise across a range of frequencies, processor 55 may command source 9 to change the frequency of input signal 11 using a command signal 69, measure the resulting phase noise, change the frequency again, measure the resulting phase noise, and so on. Advantageously, such measurement is performed automatically and accurately with no manual intervention or tuning as would be necessary in conventional phase noise test measurement systems.

Although a phase-locked discriminator system 1 represents a dramatic advance in the art, certain challenges remain. For example, suppose UUT 3 itself is a fiber optic link. A conventional fiber optic link 200 is illustrated in FIG. 2. An amplifier 201 amplifies an electrical input signal $s_{in}(t)$ to drive a laser diode 205. In turn, laser diode 205 drives an optical signal into an optical fiber 210. After passing through optical fiber 210, the optical signal is converted into an electrical signal 220 in a photodetector 215. An amplifier 230 amplifies signal 220 to provide an output signal $s_{out}(t)$. Many factors are involved in properly biasing link 200 for optimal performance. For example, matching amplifiers 201 and 230 to the link, the biasing of transistors within amplifiers 201 and 230, and the biasing of laser diode 205 and photodetector 215 are all factors that affect the additive phase noise that link 200 injects into the output signal $s_{out}(t)$. However, a designer of link 200 has no intelligent way of setting these factors. A similar situation exists for the proper setting of variables in many other systems and devices.

Accordingly, there is a need in the art for improved techniques to properly set variables in systems and devices so as to minimize phase noise in these systems and devices.

SUMMARY

In accordance with a first aspect of the invention, a phase noise test measurement system configured to optimize a controllable variable of a unit-under-test (UUT) is provided, comprising: a source for driving the UUT with an input signal, wherein the UUT provides an output signal in response to the input signal; a first variable amplifier configured to receive the output signal from the UUT and provide an output signal; a variable phase-shifter configured to phase-shift the input signal from the source and provide a phase-shifted signal; a mixer configured to mix the phase-shifted signal and the output signal from the variable amplifier to provide a mixed signal; and a processor configured to analyze a digitized version of the mixed signal and to control the variable phase-shifter and the first variable amplifier such that the input signal from the source is eliminated from the digitized version, the processor being further configured to vary the controllable variable to determine a value for the controllable variable that minimizes phase noise in the digitized version.

In accordance with another aspect of the invention, a phase noise test measurement system configured to optimize a controllable variable of a source providing an output signal, wherein the controllable variable affects phase noise in the output signal, comprises: a delay line for delaying the output signal from the source to provide a delayed output signal; a variable phase-shifter configured to phase-shift the output signal from the source and provide a phase-shifted signal; a mixer configured to mix the phase-shifted signal and a version of the delayed output signal to provide a mixed signal; and a processor configured to analyze a digitized version of the mixed signal and to control the variable phase-shifter such that the output signal from the source is eliminated from the digitized version, the processor being further configured to vary the controllable variable to determine a value for the controllable variable that minimizes phase noise in the digitized version.

In accordance with another aspect of the invention, a method includes the acts of: providing a unit-under-test, the unit-under-test providing a test signal having a carrier frequency, the unit-under-test having a controllable variable, phase-shifting a carrier signal to be in quadrature with the test signal; mixing the phase-shifted carrier signal with the test signal to provide a baseband signal; analyzing the baseband signal to measure phase noise from the unit-under-test; and based upon the measured phase noise, tuning the controllable variable.

The invention will be more fully understood upon consideration of the following detailed description, taken together with the accompanying drawings.

DETAILED DESCRIPTION

Figure 4:
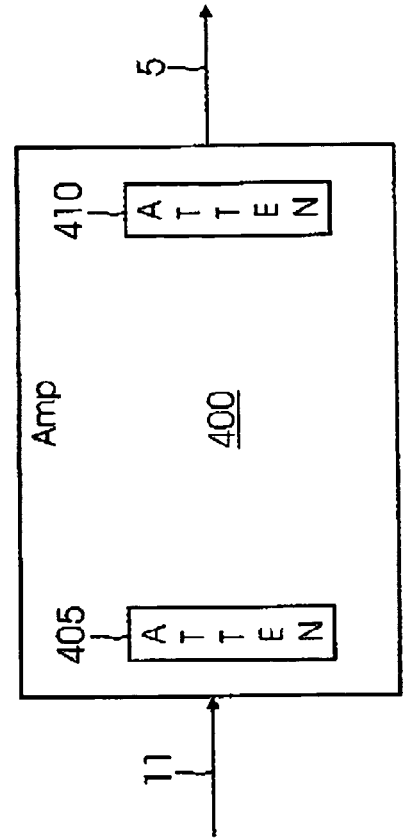
FIG. 4 illustrates an amplifier including variable attenuators set responsive to the phase noise test measurement system of FIG. 3.
Figure 3A:
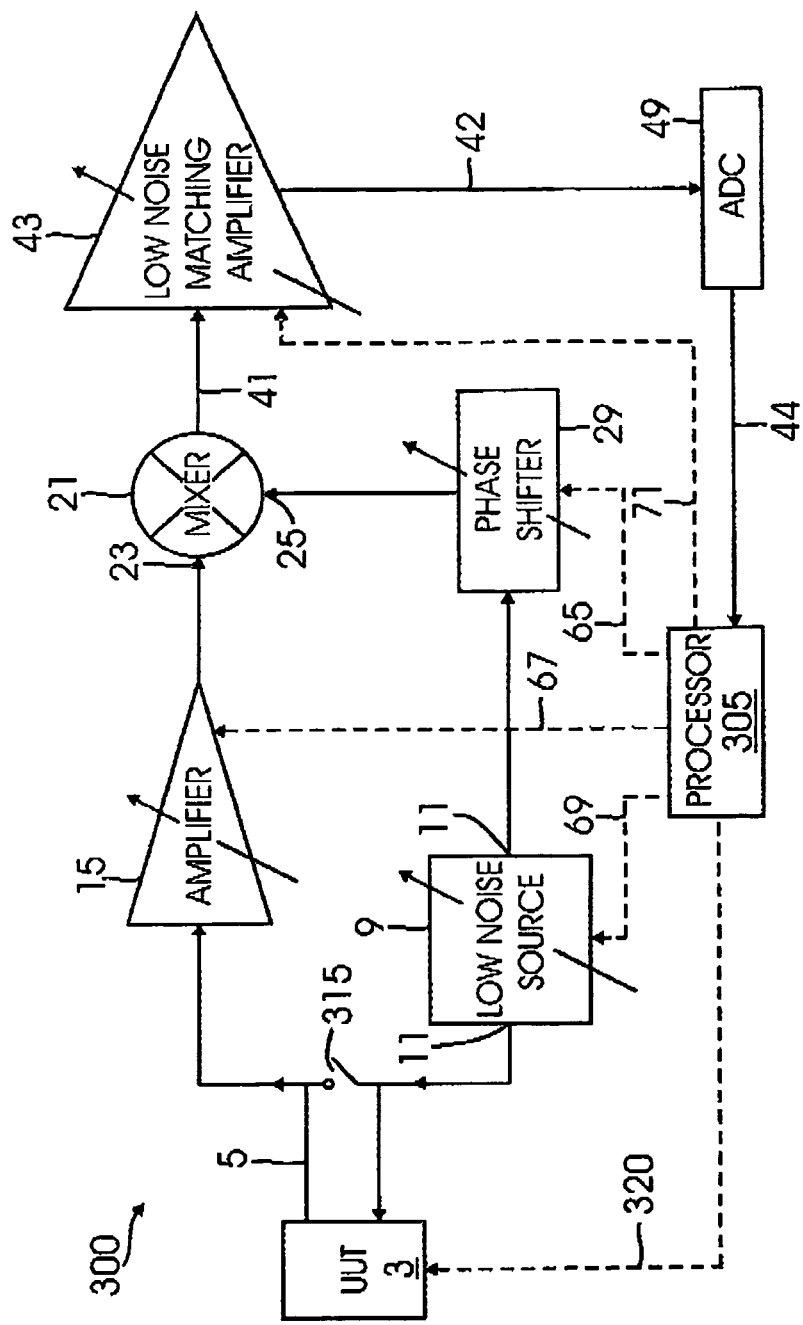
FIG. 3a illustrates a phase noise test measurement system configured to control a controllable variable of a non-source unit-under-test so as to minimize phase noise in accordance with an embodiment of the invention.

Turning now to FIG. 3a, an automated phase noise test measurement system 300 is illustrated that uses feedback to tune one or more controllable variables in a unit-under test (UUT) 3 responsive to phase noise measurements so as to minimize the additive phase noise provided by UUT 3. A processor 305 controls a variable amplifier 15 and a variable phase-shifter 29 as discussed with respect to FIG. 1. Thus, a low-noise source 9 provides an input signal 11 for driving non-source unit-under-test (UUT) 3. In response to being driven with input signal 11, UUT 3 provides an output signal 5. UUT 3 may be any device or system for which a user desires a phase noise test measurement such as an amplifier, phase-shifter, fiber optic link, or other suitable device or system of devices. UUT 3 possesses at least one controllable variable that affects the phase noise UUT 3 injects into output signal 5. For example, if UUT 3 comprises an amplifier 400 illustrated in FIG. 4, a set of variable attenuators 405 and 410 may have their attenuations varied to change the amount of additive phase noise produced in the amplifier output signal. Variable attenuator 405 functions to match amplifier 400 to an input line carrying input signal 11 whereas variable attenuator 410 functions to match amplifier 400 to an output line carrying output signal 5. Referring back to FIG. 3a, processor 305 would control attenuators 405 and 410 as further described herein. As discussed with respect to FIG. 1, output signal 5 may be amplified by variable amplifier 15 to provide an input signal 23 to a mixer 21. Source 9 also provides input signal 11 to variable phase-shifter 29. Variable phase-shifter 29 shifts input signal 11 by 90 degrees to provide a phase-shifted signal 25 to another input port of mixer 21. In this fashion, the "carrier" signal (input signal 11) is eliminated from a mixer output signal 41. To keep output signal 41 in the proper dynamic range of an analog-to-digital converter (ADC) 49, mixer output signal 41 is processed by a low-noise matching amplifier 43 to provide an output signal 42 to ADC 49.

To eliminate the carrier signal, the phase-shifted signal 25 should be in quadrature (shifted 90 degrees) with respect to the carrier (input signal 11). If quadrature is not established, a DC offset will be present in a digital output 44 from ADC 49. Processor 305 monitors digital output 44 and controls phase-shifter 29 using a control signal 65 to maintain quadrature. The elimination of the carrier signal also depends upon whether the amplitude-adjusted carrier (input signal 23) and the phase-shifted version of the carrier (signal 25) are of roughly equal power when entering mixer 21. The goal is to keep the mixer in a linear mode of operation. Thus, the powers need not be equal but merely need to be in the proper proportion with respect to each other such that linear operation is maintained. Analogous to the control of phase-shifter 29, processor 305 also controls variable amplifier 15 responsive to processing digital signal 44 using a control signal 67 to maintain mixer 21 in linear operation. Those of ordinary skill in the art will appreciate that variable amplifier 15 does not just amplify but may also attenuate responsive to control signal 67. For example, if UUT 3 is an amplifier, variable amplifier 15 will have to attenuate output signal 5 to keep signals 23 and 25 in comparative power equality. Processor 305 may also control low-noise matched amplifier 43 using a control signal 71 to maintain output signal 42 in the proper dynamic range for ADC 49.

Having controlled the components for quadrature operation, processor 305 eliminates the carrier from digital output 44 from ADC 49 such that digital output 44 simply represents the phase noise. The phase noise injected by low noise source 9 may be accounted for by a calibrating operation such that UUT 3 is removed and low noise source 9 simply feeds a delay line (not illustrated) directly through, for example, operation of a switch 315. An output from this delay line would then be processed by variable amplifier 15 as described above. The resulting phase noise in digital signal 44 during calibration may be stored in a memory associated with processor 305. Thus, during testing of UUT 3, processor 305 (or a spectrum analyzer associated with processor 305) may perform a fourier analysis of digital signal 44 to determine the phase noise power. The measured phase noise power may then be adjusted by the phase noise injected by source 9 to determine the additive phase noise supplied by UUT 3.

This phase noise measurement depends upon the control of the controllable variable(s) within UUT 3. For example, should UUT 3 comprise amplifier 400 (FIG. 4), the measured phase noise will depend upon the settings of attenuators 405 and 410. Processor 305 may thus vary these settings (and hence the corresponding attenuation provided by attenuators 405 and 41) using a command signal 320 and observe the resulting phase noise in digital signal 44. For example, if the phase noise has increased when increased attenuation was commanded, processor 305 may repeat the measurement but command a lesser amount of attenuation. It will be appreciated that the degrees of freedom and interaction of the variables controlled within UUT 3 will increase in complexity as the number of variables increases. However, processor 305 may be configured to use techniques common to the radio industry to determine an optimum setting of these variables. Such methods of toggling controls for maximum efficiency and noise floor may be easily automated because the processor is able to detect and store optimized data sets. The "best fit" method or any signal processing method capable of "best data fit" determination may be used to determine an optimum setting for the controllable variables.

Figure 1:
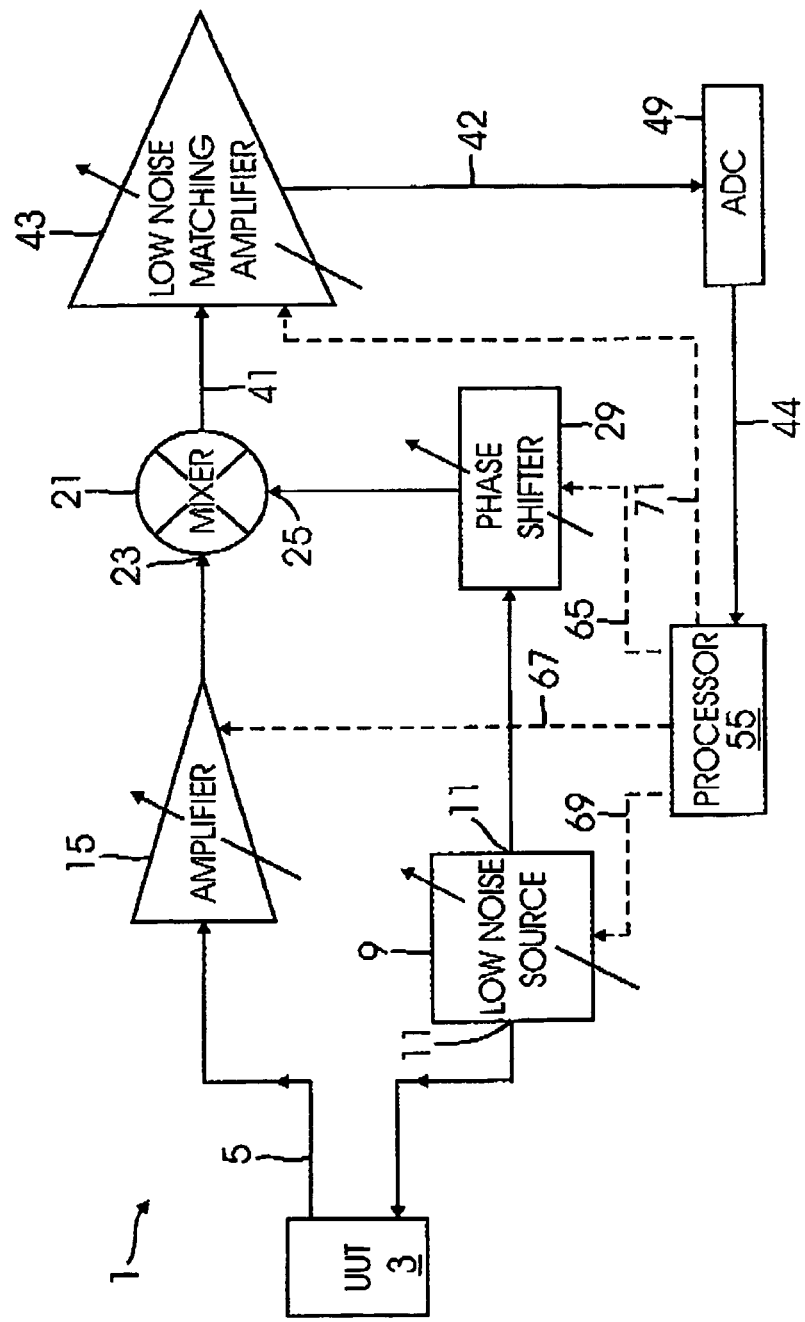
FIG. 1 is a block diagram of an automated phase noise test measurement system.

As discussed with respect to FIG. 1, the phase noise measured in digital signal 44 depends upon the frequency of input signal 11 provided by source 9. For example, UUT 3 may be quite noisy at one frequency but less so at another. To measure phase noise across a range of frequencies, processor 305 may command source 9 to change the frequency of input signal 11 using a command signal 69. The process of optimizing phase noise responsive to variations of the controllable variables within UUT 3 would then be repeated, the resulting phase noise noted, the frequency altered again, and so on.

Figure 2:
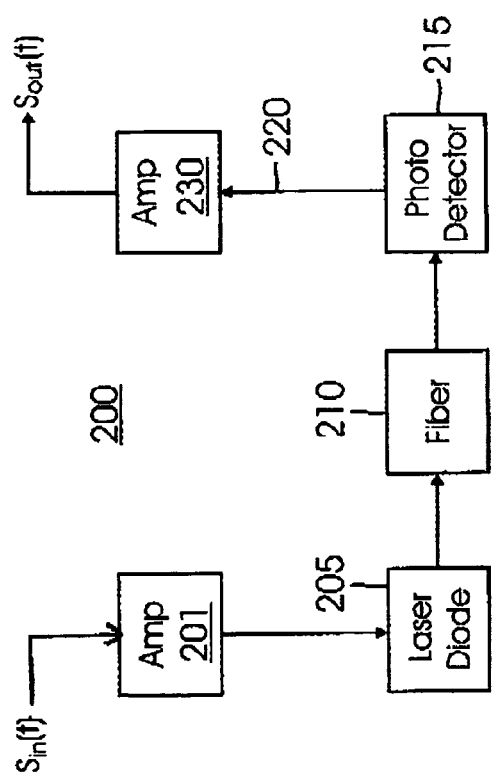
FIG. 2 is a block diagram of a conventional fiber optic link.

The amount and type of variables controllable by processor 305 within a UUT is virtually endless. For example, should UUT 3 comprise an optic fiber link such as link 200 discussed in FIG. 2, the amplifiers may be configured with attenuators as discussed with respect to FIG. 4 to provide four variables: the amount of attenuation introduced by each attenuator. In addition (or alternatively), the biasing of transistor(s) within the amplifiers may be made a controllable variable. Similarly, the biasing of the laser diode and the photodetector may also be designed as controllable variables. Having determined the optimal settings of the controllable variables, a manufacturer may then manufacture systems or devices in which these variables are not controllable but configured as determined using phase noise test measurement system 300.

Figure 3B:
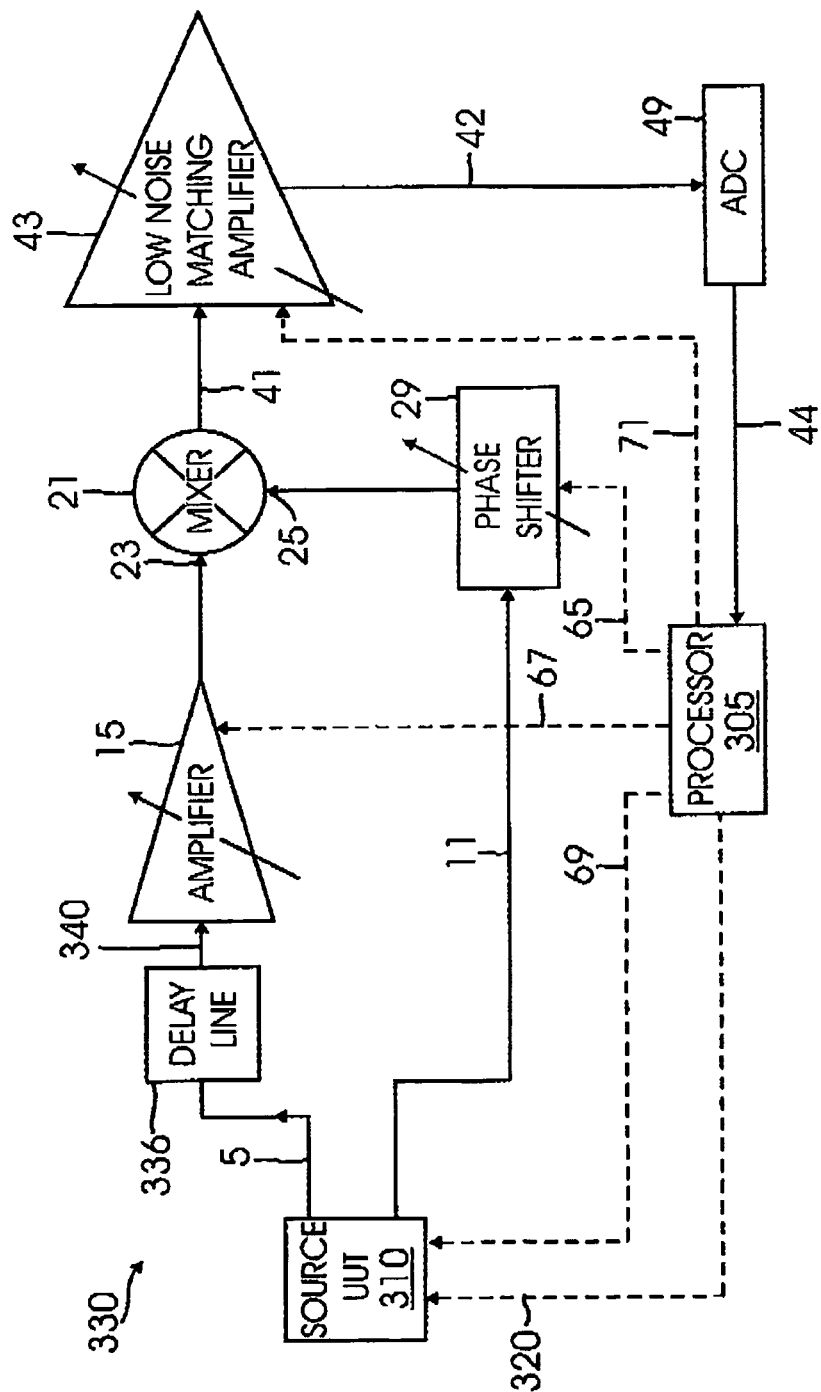
FIG. 3b illustrates a phase noise test measurement system configured to control a controllable variable of a source unit-under-test so as to minimize phase noise in accordance with an embodiment of the invention.

Those of ordinary skill in the art will appreciate that the illustrated separation between UUT 3 and low noise source 11 is a mere conceptual separation should UUT be a source UUT such as an oscillator. In such a case, the source is the UUT. As such, it would be redundant to drive a source UUT such as an oscillator with a source—there is no need for an external carrier signal source for a source UUT. Turning now to FIG. 3b, a phase noise test measurement system 330 is illustrated for a source UUT 310. To analyze the phase noise of a source UUT 310, a delay line 336 forms a delayed version 340 of output signal 5 from source UUT 310. Note that in case of a perfect source that provides a sinusoidal output signal cos wt, the phase difference between arbitrary times t1 and t2 depends solely upon the delay period between these times. However, in a real world source, there will also be some phase noise that affects this phase difference. In general, it can be shown that the selection of the delay period affects the ability of phase noise test measurement system 330 to measure phase noise at smaller frequency offsets to the carrier signal frequency as well as the sensitivity of the phase noise measurement. As the delay provided by delay line 336 is increased, the ability to measure phase noise at smaller offsets from the carrier frequency is enhanced as well as the sensitivity. However, delay cannot be arbitrarily increased because attenuation through the delay line may become too severe and affect the measurement. Inspection of FIGS. 3a and 3b illustrates the fundamental similarity between the characterization of a source UUTs and non-source UUTs. Regardless of whether the UUT is a source, control and operation of the variable amplifier 15, mixer 21, low-noise matching amplifier 43, ADC 49, and phase-shifter 29 is the same. Thus, source UUT 310 provides input signal 11 to phase shifter 29 analogously as discussed with respect to low noise source 9 of FIG. 3a. Variable amplifier provides output signal 23 to mixer 21, which mixes this signal with a phase-shifted version 25 of carrier signal 11. Processor 305 controls amplifier 15 with control signal 67 to maintain linear operation of mixer 21. Processor 305 operates to tune controllable variable(s) within source UUT 310 using command signal 320 analogously as discussed with respect to the tuning of non-source UUT 3. Similarly, processor 305 controls the carrier frequency used by source UUT 310 using control signal 69 as discussed with respect to FIG. 3a.

Figure 5:
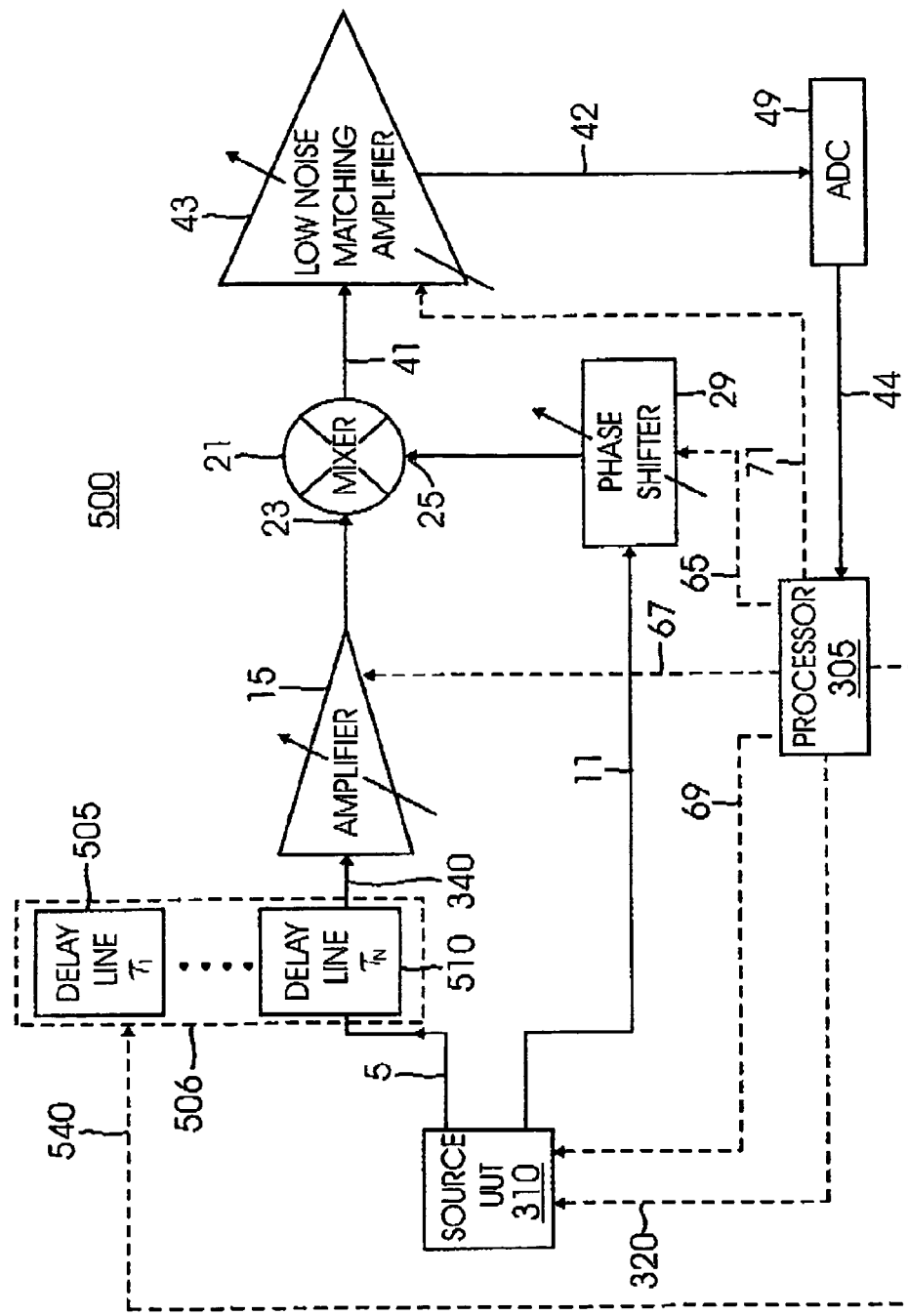
FIG. 5 illustrates a phase noise test measurement system configured to control a controllable variable of a source unit-under-test in accordance with an embodiment of the invention.

Because the amount of delay provided by delay line 336 has such a profound effect on the characterization of the phase noise from a source 150T, a selectable delay feature as provided by a phase noise test measurement system 500 as illustrated in FIG. 5 is advantageous. This selectable delay feature is provided by an adjustable delay line 506 that delays output signal 5 from source MIT 310. Depending upon the desired sensitivity and frequency offset of the phase noise measurement, processor 305 selects a delay line within adjustable delay line 506 using control signal 540. For example, adjustable delay line 506 may comprise a plurality of delay lines that provide a corresponding plurality of delays, from delay $\tau_1$ to delay $\tau_N$. For illustration clarity, only a delay line 505 having delay $\tau_1$ and a delay line 510 having delay $\tau_N$ are shown in FIG. 5 from the plurality of delay lines that are included within adjustable delay line 506. These delay lines may be selected through activation of switches such as FETs (not illustrated). Regardless of which delay line is selected within adjustable delay line 506, variable amplifier 15 then amplifies delayed signal 340 from adjustable delay line 506 and provides output signal 23 to mixer 21 analogously as discussed with respect to FIG. 3b. Similarly, output signal 11 from source 509 is also phase-shifted through variable phase-shifter 29 to form phase-shifted signal 25 that is also received by mixer 21. Source 509 includes a controllable variable such as a transistor bias voltage or other variable controllable by a control signal 530 from processor 305. Thus, system 500 operates analogously as discussed with respect to system 350 of FIG. 3b. Responsive to measuring the phase noise of source DTT 310, processor 305 drives control signal 320 to tune controllable variable(s) within source UUT 310 so as to optimize the phase noise performance.

Although the invention has been described with respect to particular embodiments, this description is only an example of the invention's application and should not be taken as a limitation. For example, the order of variable amplifier 15 and delay line 336 in FIG. 3b may be reversed such that the delay line provides the delayed version to the mixer. Consequently, the scope of the invention is set forth in the following claims.

I claim:

1. A phase noise test measurement system configured to optimize a controllable variable of a unit-under-test (UUT), comprising:
    a source for driving the UUT with an input signal, wherein the UUT provides an output signal in response to the input signal;
    a first variable amplifier configured to receive the output signal from the UUT and provide an output signal;
    a variable phase-shifter configured to phase-shift the input signal from the source and provide a phase-shifted signal;
    a mixer configured to mix the phase-shifted signal and the output signal from the variable amplifier to provide a mixed signal; and
    a processor configured to analyze a digitized version of the mixed signal and to control the variable phase-shifter and the first variable amplifier such that the input signal from the source is eliminated from the digitized version, the processor being further configured to vary the controllable variable to determine a value for the controllable variable that minimizes phase noise in the digitized version.

2. The system of claim 1, further comprising an analog-to-digital converter for providing the digitized version.

3. The system of claim 2, further comprising a second variable amplifier configured to variably amplify the mixer output to provide a signal to the analog-to-digital converter.

4. The system of claim 3, wherein the processor is further configured to control the second variable amplifier to maintain its output within a desired dynamic range of the analog-to-digital converter.

5. The system of claim 1, wherein the UUT is fiber optic link and the controllable variable is an attenuator setting.

6. The system of claim 1, wherein the UUT is a fiber optic link and the controllable variable is a bias voltage.

7. A phase noise test measurement system configured to optimize a controllable variable of a source UUT providing an output signal, wherein the controllable variable affects phase noise in the output signal, comprising:
    a delay line for delaying the output signal from the source UUT to provide a delayed output signal;
    a variable phase-shifter configured to phase-shift the output signal from the source and provide a phase-shifted signal;
    a mixer configured to mix the phase-shifted signal and a version of the delayed output signal to provide a mixed signal; and
    a processor configured to analyze a digitized version of the mixed signal and to control the variable phase-shifter such that the output signal from the source is eliminated from the digitized version, the processor being further configured to vary the controllable variable to determine a value for the controllable variable that minimizes phase noise in the digitized version.

8. The system of claim 7, wherein the delay line comprises a plurality of selectable delay lines, each selectable delay line having a unique delay.

9. The system of claim 8, further comprising a variable amplifier configured to variably amplify the mixer output to provide a signal to the analog-to-digital converter.

10. The system of claim 9, wherein the processor is further configured to control the variable amplifier to maintain its output within a desired dynamic range of the analog-to-digital converter.

11. The system of claim 7, wherein the source is a low-noise source.

12. The system of claim 7, further comprising a variable amplifier configured to provide the version of the delayed output signal to the mixer.

13. The system of claim 12, wherein the processor is configured to control the variable amplifier so as to maintain linear operation of the mixer.

14. A method, comprising:
    providing a unit-under-test, the unit-under-test providing a test signal having a carrier frequency, the unit-under-test having a controllable variable, phase-shifting a carrier signal to be in quadrature with the test signal;
    mixing the phase-shifted carrier signal with the test signal to provide a baseband signal;
    analyzing the baseband signal to measure phase noise from the unit-under-test; and
    based upon the measured phase noise, tuning the controllable variable to minimize the measured phase noise.

15. The method of claim 14, wherein the controllable variable is an attenuation setting.

16. The method of claim 14, wherein the unit-under-test is a photonic delay line and wherein the controllable variable is a bias setting for a laser diode.

17. The method of claim 14, wherein the unit-under-test is an amplifier.

18. The method of claim 14, further comprising: adjusting a power of the test signal to ensure that the mixing is linear.

19. The method of claim 14, further comprising: digitizing the baseband signal and fast fourier transforming the digitized baseband signal to measure the phase noise from the unit-under-test.

20. The method of claim 14, further comprising controlling the phase-shifting based upon the analysis of the baseband signal.

* * * * *